United States Patent
Noll

(10) Patent No.: US 12,154,642 B2
(45) Date of Patent: Nov. 26, 2024

(54) BUILT-IN MEMORY TESTS FOR AIRCRAFT PROCESSING SYSTEMS

(71) Applicant: Hamilton Sundstrand Corporation, Charlotte, NC (US)

(72) Inventor: Christopher Brian Noll, Glastonbury, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 330 days.

(21) Appl. No.: 17/500,053

(22) Filed: Oct. 13, 2021

(65) Prior Publication Data
US 2023/0110926 A1    Apr. 13, 2023

(51) Int. Cl.
G11C 29/38    (2006.01)
G11C 29/10    (2006.01)
G11C 29/44    (2006.01)
G11C 29/04    (2006.01)

(52) U.S. Cl.
CPC .............. *G11C 29/38* (2013.01); *G11C 29/10* (2013.01); *G11C 29/4401* (2013.01); *G11C 2029/0407* (2013.01)

(58) Field of Classification Search
CPC ...................................... G11C 29/38
USPC ........................................ 365/201
See application file for complete search history.

(56) References Cited

U.S. PATENT DOCUMENTS

| | | | |
|---|---|---|---|
| 5,694,014 A * | 12/1997 | Hegg | G05D 1/0077 318/564 |
| 7,334,159 B1 | 2/2008 | Callaghan | |
| 8,358,548 B2 | 1/2013 | Manna et al. | |
| 8,411,519 B2 | 4/2013 | Byom et al. | |
| 8,862,953 B2 | 10/2014 | Gollub et al. | |
| 9,361,196 B2 | 6/2016 | Kleveland et al. | |
| 9,691,505 B2 | 6/2017 | Das et al. | |
| 9,880,900 B2 | 1/2018 | Reed et al. | |
| 10,614,906 B2 | 4/2020 | Ryu et al. | |
| 10,665,319 B1 | 5/2020 | Levin et al. | |
| 10,706,952 B1 | 7/2020 | Gregor et al. | |
| 2005/0223290 A1* | 10/2005 | Berbaum | G06F 11/27 714/E11.169 |
| 2006/0041345 A1* | 2/2006 | Metcalf | B64D 45/0031 340/5.2 |

(Continued)

FOREIGN PATENT DOCUMENTS

KR    20140117716 A    10/2014

OTHER PUBLICATIONS

European Search Report Issued in European Application No. 22200916.9-1203 dated Feb. 24, 2023; 6 Pages.

*Primary Examiner* — Muna A Techane
(74) *Attorney, Agent, or Firm* — CANTOR COLBURN LLP

(57) ABSTRACT

Examples described herein provide a method for testing a memory associated with a processing system of an aircraft. The method includes performing, during operation of the processing system, an operational built-in test on the memory. The method further includes, responsive to detecting an error in the memory during the operational built-in test, performing a focused memory test at a location in the memory of the error. The method further includes, responsive the error being confirmed by the focused memory test, causing the processing system to be taken offline.

20 Claims, 4 Drawing Sheets

(56) References Cited

U.S. PATENT DOCUMENTS

2007/0135975 A1\* 6/2007 Stange .................. B64C 13/505
701/3

\* cited by examiner

BUILT-IN MEMORY TESTS FOR AIRCRAFT PROCESSING SYSTEMS

BACKGROUND

Exemplary embodiments pertain to the art of aircraft processing systems.

Processing systems can be used to monitor and control aspects of an aircraft. One example of such a processing system is an aircraft flight control computer (FCC), which controls actuators that in turn control flight control surfaces of the aircraft to cause the aircraft to maneuver based on pilot/system inputs. Another example of such a processing system is a control system of a gas turbine engine, which controls the operation of the gas turbine engine and monitors the performance of the gas turbine engine. These and other processing systems are used to monitor and control aspects of the aircraft.

BRIEF DESCRIPTION

Embodiments of the present invention are directed to built-in memory tests for aircraft processing systems.

In one exemplary embodiment, a computer-implemented method for testing a memory associated with a processing system of an aircraft is provided. The method includes performing, during operation of the processing system, an operational built-in test on the memory. The method further includes, responsive to detecting an error in the memory during the operational built-in test, performing a focused memory test at a location in the memory of the error. The method further includes, responsive the error being confirmed by the focused memory test, causing the processing system to be taken offline.

In addition to one or more of the features described herein, or as an alternative, further embodiments of the method may include, responsive the error not being confirmed by the focused memory test, reinitializing the processing system.

In addition to one or more of the features described herein, or as an alternative, further embodiments of the method may include, prior to initiating operation of the processing system, performing a power-on built-in test on the memory.

In addition to one or more of the features described herein, or as an alternative, further embodiments of the method may include, responsive to detecting an initialization error during the power-on built-in test, causing the processing system to be taken offline.

In addition to one or more of the features described herein, or as an alternative, further embodiments of the method may include, responsive the error being confirmed by the focused memory test, initiating a backup processing system.

In addition to one or more of the features described herein, or as an alternative, further embodiments of the method may include that the processing system is a fly-by-wire flight control computer.

In addition to one or more of the features described herein, or as an alternative, further embodiments of the method may include that the focused memory test is performed based at least in part on data stored at the location in the memory of the error.

In addition to one or more of the features described herein, or as an alternative, further embodiments of the method may include saving the data stored at the location and the location as saved data and a saved location.

In addition to one or more of the features described herein, or as an alternative, further embodiments of the method may include using the saved data and the saved location to perform a subsequent power-on built-in test.

In another exemplary embodiment a flight control computer is provided. The flight control computer includes a memory having computer readable instructions, and a processing device for executing the computer readable instructions, the computer readable instructions controlling the processing device to perform operations. The operations are to perform, during operation of the flight control computer, an operational built-in test on the memory. The operations are further to, responsive to detecting an error in the memory during the operational built-in test, perform a focused memory test at a location in the memory of the error. The operations are further to, responsive the error being confirmed by the focused memory test, cause the flight control computer to be taken offline.

In addition to one or more of the features described herein, or as an alternative, further embodiments of the flight control computer may include the computer readable instructions controlling the processing device to perform further operations to, responsive the error not being confirmed by the focused memory test, reinitialize the flight control computer.

In addition to one or more of the features described herein, or as an alternative, further embodiments of the flight control computer may include the computer readable instructions controlling the processing device to perform further operations to, prior to initiating operation of the flight control computer, perform a power-on built-in test on the memory.

In addition to one or more of the features described herein, or as an alternative, further embodiments of the flight control computer may include the computer readable instructions controlling the processing device to perform further operations to, responsive to detecting an initialization error during the power-on built-in test, cause the flight control computer to be taken offline.

In addition to one or more of the features described herein, or as an alternative, further embodiments of the flight control computer may include the computer readable instructions controlling the processing device to perform further operations to, responsive the error being confirmed by the focused memory test, initiate a backup flight control computer.

In addition to one or more of the features described herein, or as an alternative, further embodiments of the flight control computer may include that the flight control computer is a fly-by-wire flight control computer.

In addition to one or more of the features described herein, or as an alternative, further embodiments of the flight control computer may include that the focused memory test is performed based at least in part on data stored at the location in the memory of the error.

In addition to one or more of the features described herein, or as an alternative, further embodiments of the flight control computer may include the computer readable instructions controlling the processing device to perform further operations to save the data stored at the location and the location as saved data and a saved location.

In addition to one or more of the features described herein, or as an alternative, further embodiments of the flight control computer may include the computer readable instructions controlling the processing device to perform further operations to use the saved data and the saved location to perform a subsequent power-on built-in test.

In another exemplary embodiment a flight control computer is provided. The flight control computer includes a memory and a built-in test logic. The built-in test logic is to perform, during operation of the flight control computer, an operational built-in test on the memory. The built-in test logic is further to, responsive to detecting an error in the memory during the operational built-in test, perform a focused memory test at a location in the memory of the error. The built-in test logic is further to, responsive the error being confirmed by the focused memory test, cause the flight control computer to be taken offline.

In addition to one or more of the features described herein, or as an alternative, further embodiments of the flight control computer may include the built-in test logic further to: responsive the error not being confirmed by the focused memory test, reinitialize the flight control computer; prior to initiating operation of the flight control computer, perform a power-on built-in test on the memory to confirm an error detection circuitry of the memory; responsive to detecting an initialization error during the power-on built-in test, cause the flight control computer to be taken offline; and responsive the error being confirmed by the focused memory test, initiate a backup flight control computer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
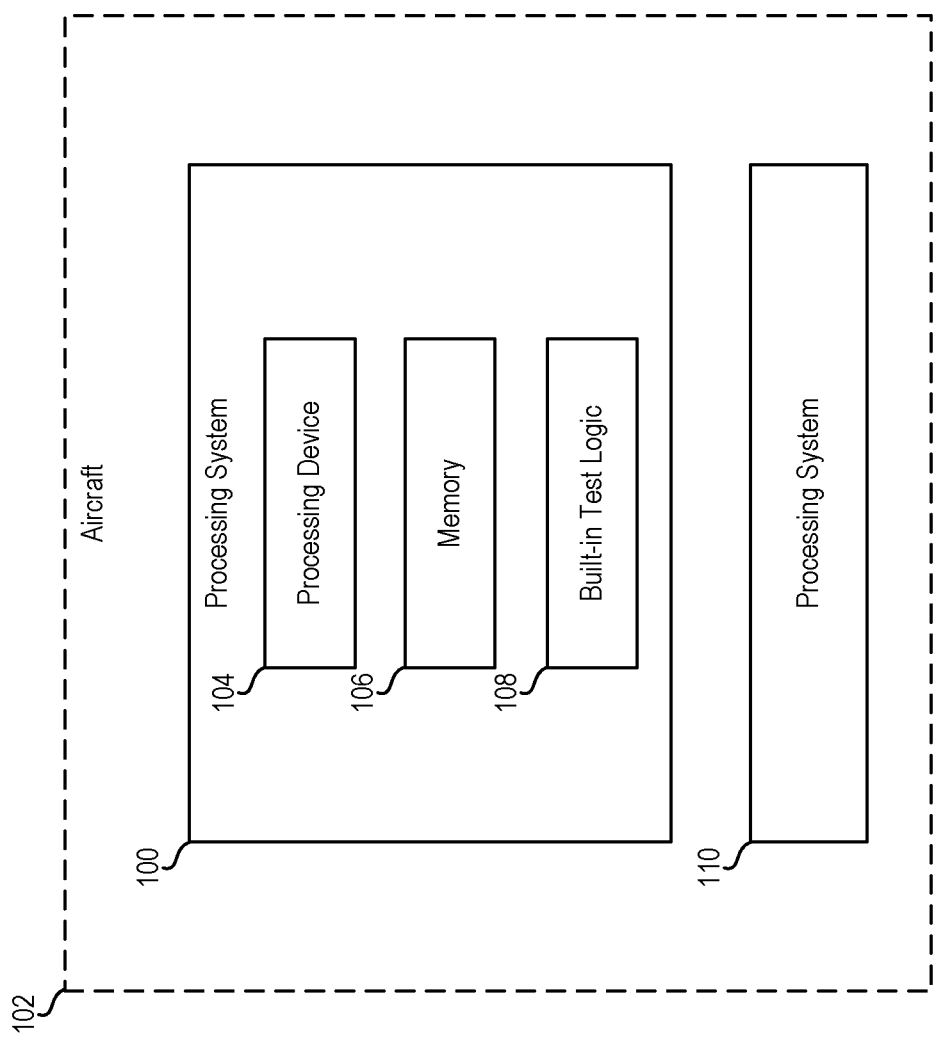
FIG. 1 depicts a block diagram of a processing system for an aircraft according to one or more embodiments described herein.

A detailed description of one or more embodiments of the disclosed apparatus and method are presented herein by way of exemplification and not limitation with reference to the Figures.

Newer computing platforms (e.g., processing systems) can contain very large amounts of memory, such as random access memory (RAM). For example, such newer processing systems can include memory measured in gigabytes compared to older systems that use memory in magnitude of megabytes or even kilobytes. Some memory is configured with error checking/correcting (ECC) capabilities that provide for the memory detecting erroneous data or instruction values stored in the memory and making corrections thereto. Both these features introduce complexity in the ability to test the memory as part of a startup procedure of a processing system of an aircraft this is a safety critical system that relies on the memory for safety critical functionality (e.g., flight monitoring and control, engine monitoring and control, etc.).

Due to the large amount of memory present in some aircraft processing systems, it is not feasible to test the entire memory (including using patterns to detect errors in the ECC portion of the memory) during system start up. Such tests are simply too time consuming to be practical. For example, a power-on built-in test performed at system startup may take approximately 30 seconds; however, a full test of the entire memory may take 5-10 minutes, which is unacceptable. Due to the safety critical nature of many aircraft processing systems, it is important to detect when a hard fault (as opposed to a soft fault) of a memory occurs so that a processing system associated with the memory having the hard fault can be taken offline and/or so another processing system can be initialized. A hard fault is a fault of the memory itself, while a soft fault is an unanticipated value stored in the memory. Soft faults can be, for example, a bit flip ("0" to "1" or "1" to "0") such as due to radiation or interference.

One or more embodiments described herein provide for built-in memory tests for aircraft processing systems. For example, a built-in test to facilitate a restart condition when an ECC error is detected at a particular memory location. The built-in test can use the information provided by an ECC detection mechanism to, upon restart, scope a robust memory test of the block associated with the failure to determine if the error is a hard fault or a soft fault.

According to one or more embodiments described herein, a method for testing a memory associated with a processing system of an aircraft. The method can include performing, during operation of the processing system, an operational built-in test on the memory. Responsive to detecting an error in the memory during the operational built-in test, a focused memory test is performed at a location in the memory of the error. Responsive the error being confirmed by the focused memory test, the processing system can be taken offline and/or a second processing system can be initialized, so as to replace the processing system with the memory error.

The above-described aspects address the shortcomings of the prior art by providing targeted confirmation that areas of memory that experience an error (e.g., a data read error) have either a hard fault or a soft fault (e.g., due to a single event effect (SEE)). This enables safety critical processing systems to be tested reliably and taken offline when hard fault memory errors are detected.

Turning now to FIG. 1, a processing system 100 having a memory to be tested according to one or more embodiments described herein. In this example, the processing system 100 is disposed in an aircraft 102, and one or more additional processing systems (e.g., the processing system 110) can also be disposed in the aircraft 102 according to one or more embodiments described herein. The processing system 102 can be, for example, flight critical system, such as a flight control computer, engine controller, etc. In some examples, the processing system 110 serves as a backup or redundant processing system for the processing system 100. The processing system 100 includes a processing device 104 and a memory 106. According to one or more embodiments described herein, the processing system 100 also includes a built-in memory test logic 108.

The processing system 100 can include any type or combination of central processing unit (CPU), including one or more of: a microprocessor, a digital signal processor (DSP), a microcontroller, an application specific integrated circuit (ASIC), a field programmable gate array (FPGA), or the like. Thus, the processing system 100 can be said to include processing circuitry. The memory 106 can store data and instructions that are executed by the processing device 104. In embodiments, the memory 106 may include random access memory (RAM), read only memory (ROM), or other electronic, optical, magnetic, or any other computer readable medium onto which is stored data and algorithms in a non-transitory form. According to one or more embodiments described herein, the processing system 100 can include other suitable components (e.g., input/output).

The processing system 100 is configured to test the memory 106 using one or more built-in tests. In some examples, the built-in tests are stored as computer readable instructions executable by the processing device 104. In other examples, the built-in tests are stored in special purpose hardware (e.g., built-in test logic 108). For example, the built-in test logic 108 can be an ASIC, FGPA, and/or the like.

Figure 2:
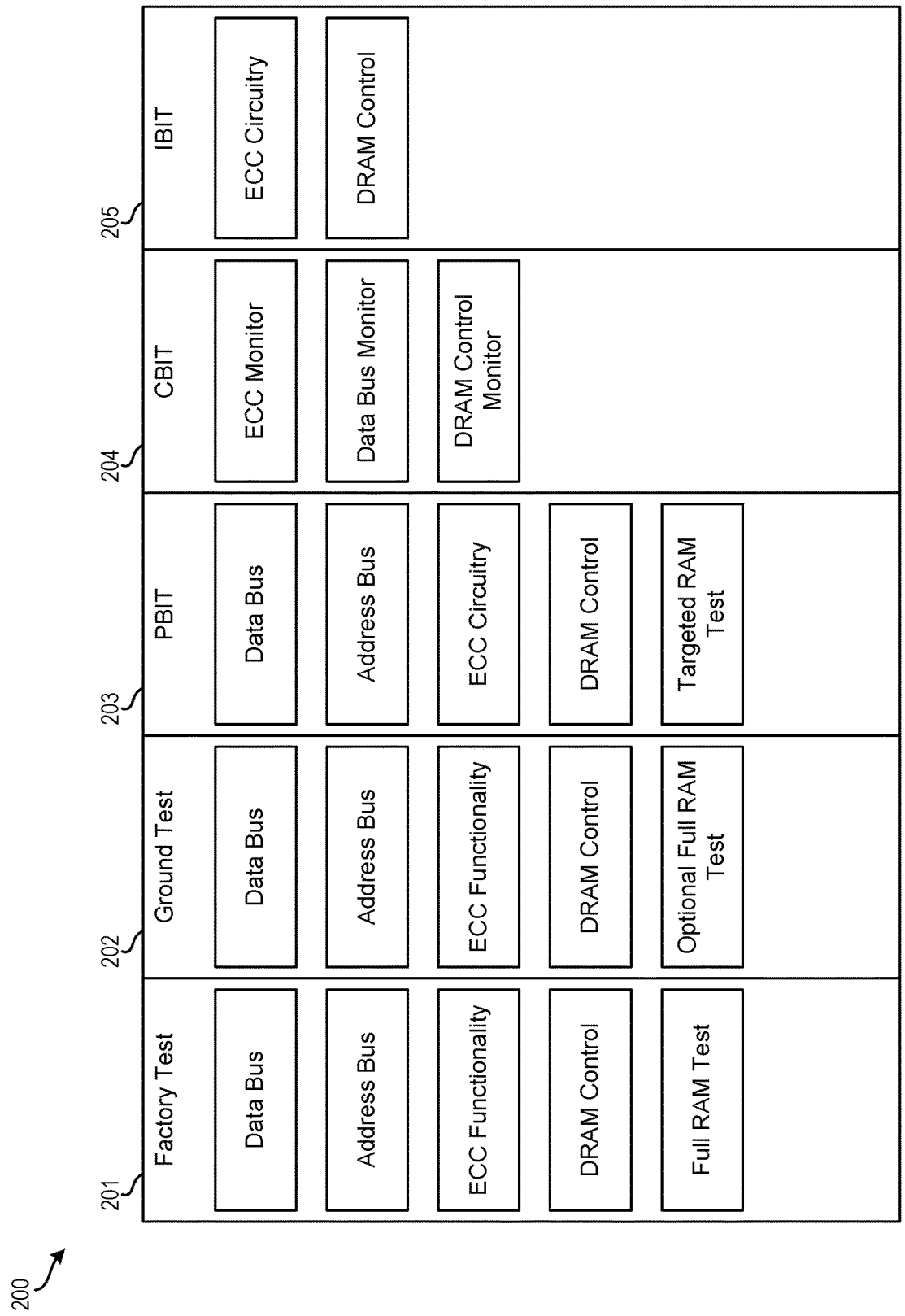
FIG. 2 depicts a table of memory tests for aircraft processing systems according to one or more embodiments described herein.

FIG. 2 depicts a table 200 of memory tests for aircraft processing systems according to one or more embodiments described herein. One example of a memory test is a factory test 201 of the memory 106, which is sometimes referred to as an acceptance test procedure. That is, the factory test 201 is performed during or immediately after fabrication of the memory 106 by the memory vendor. Another example of a memory test is a ground test 202 that is an off-aircraft field test. The ATP test 202 and the ground test 202 are performed by external devices/systems. However, the processing system 100 can include one or more built-in tests, which are built into the memory 106 as instructions executable by the processing device 104 and/or which are built into the built-in test logic 108.

Examples of built-in tests include a power-on built-in test (PBIT) 203, a continuous built-in test (CBIT) 204, and an initiated built-in test (IBIT) 205. The PBIT 203 tests the memory 106 when the processing system 100 is initialized (i.e., powered on). The CBIT 204 (also referred to as an "operational built-in test") tests the memory 106 continuously as a background process while the processing system 100 is operating. IBIT 205 (also referred to as a "focused memory test") tests the memory 106 on-demand. For example, the IBIT 205 can be initiated when the CBIT 204 detects an error.

In cases where a processing system has a smaller amount of memory (e.g., 64 MB of memory), the PBIT 203 can be exhaustive such that all the memory can be comprehensively tested during startup of the processing system. Such a PBIT 203 could take on the order of about 10 seconds. However, for more complex processing systems having greater amounts of memory (e.g., 4 GB of memory), the PBIT 203 cannot be comprehensive due to time constraints. Such a test may take in the order of about 640 seconds. This amount of time is unreasonable for aircraft and thus, the increased amount of memory gives more opportunity for soft errors, such as due to SEE.

Figure 3:
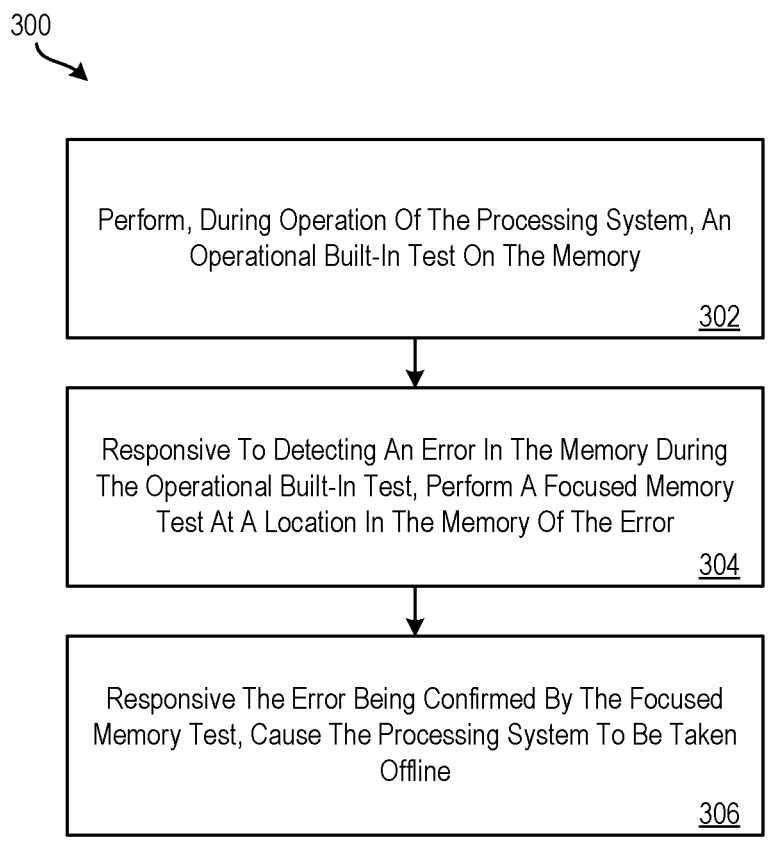
FIG. 3 depicts a flow diagram of a method for built-in memory tests for aircraft processing systems according to one or more embodiments described herein.

FIG. 3 depicts a flow diagram of a method 300 for built-in memory tests for aircraft processing systems according to one or more embodiments described herein. The method 300 can be implemented using the system 100 of FIG. 1, for example, or another suitable system or device.

At block 302, the processing system 100 (e.g., a fly-by-wire flight control computer) performs, during operation of the processing system 100, an operational built-in test (e.g., the CBIT 204) on the memory 106. In some examples, the operational built-in test is performed continuously during operation of the processing system 100. In some cases, the operational built-in test detects an error (or errors).

At block 304, responsive to the operational built-in test detecting an error in the memory 106 during the operational built-in test, the processing system 100 performs a focused memory test (e.g., the IBIT 205) at a location in the memory of the error. That is, the operational built-in test detects an error (or errors) and determines a location in the memory 106 associated with the error (or locations of errors). The processing system 100 uses the location to perform focused memory test on the location of the memory 106 associated with the error detected by the operational built-in test. According to one or more embodiments described herein, the focused memory test is performed based at least in part on data stored at the location in the memory of the error. The location and/or the data can be saved as saved data and a saved location respectively, which can be used in subsequent memory tests (e.g., during a next PBIT 203).

The focused memory test either confirms the error (e.g., the focused memory test detects an error at the location) or does not confirm the error (e.g., the focused memory test does not detect an error at the location. In the case of the error not being confirmed by the focused memory test, a soft error is said to have occurred. In some examples, if the focused memory test does not confirm the error, the processing system 100 can be reinitialized (e.g., restarted).

However, in the case of the error being confirmed by the focused memory test, a hard error is said to have occurred. In such cases, at block 306, responsive the error being confirmed by the focused memory test, the processing system 100 is taken offline. According to one or more embodiments described herein, responsive the error being confirmed by the focused memory test, a backup processing system (e.g., the processing system 110) can be initialized (powered up).

Additional processes also may be included. As an example, the processing system 100 can, prior to initiating operation of the processing system, perform a power-on built-in test (e.g., the PBIT 203) on the memory 106. If, during the PBIT 203, an error is detected (i.e., responsive to detecting an initialization error during the power-on built-in test), processing system 100 is taken offline (e.g., powered down). It should be understood that the process depicted in FIG. 3 represents an illustration, and that other processes may be added or existing processes may be removed, modified, or rearranged without departing from the scope of the present disclosure.

Figure 4:
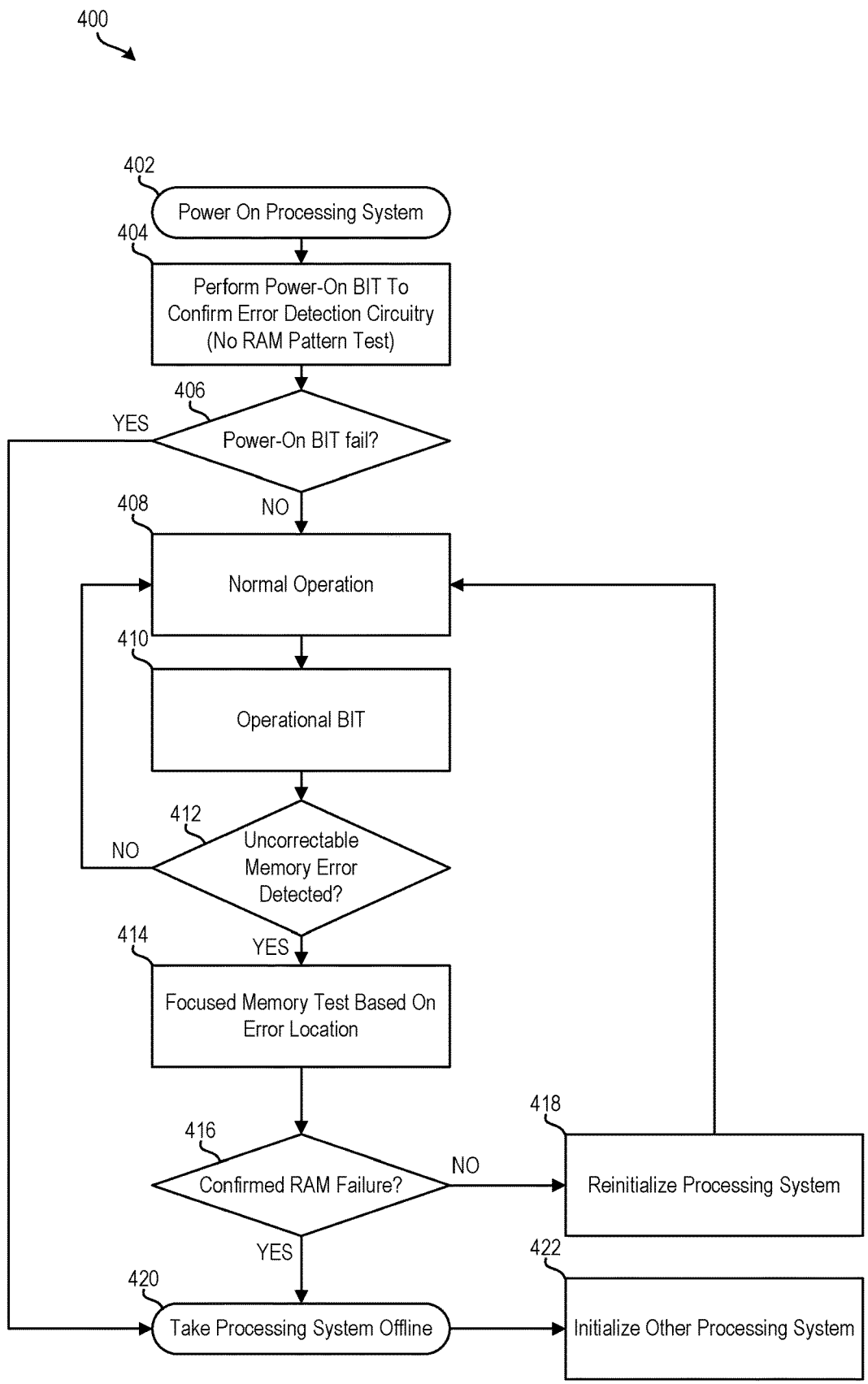
FIG. 4 depicts a flow diagram of a method for built-in memory tests for aircraft processing systems according to one or more embodiments described herein.

FIG. 4 depicts a flow diagram of a method 400 for built-in memory tests for aircraft processing systems according to one or more embodiments described herein. The method 400 can be implemented using the system 100 of FIG. 1, for example, or another suitable system or device.

At block 402, the processing system 100 is powered on (initialized). At block 404, the PBIT 203 is performed, such as to confirm error detection circuitry. No pattern testing is performed during the PBIT 203 according to one or more embodiments described herein. At decision block 406, it is determined whether the PBIT 203 detected a failure/error. If it is determined that a failure/error occurred, the processing system 100 is taken offline at block 420. In some cases, another processing system (e.g., the processing system 110) is then initialized at block 422.

If, at decision block 406, it is determined that the PBIT 203 did not detect a failure/error, the method 400 proceeds to block 408, where the processing system 100 begins normal operation. At block 410, during normal operation of the processing system 100, an operational built-in test (e.g., the CBIT 204) is performed. At decision block 412, it is determined whether the operational built-in test detects an error (e.g., an uncorrectable memory error). If not, the method 400 returns to block 408, and the operational built-in test at block 410 is repeated. If, however, at decision block 412 it is determined that an error was detected, the method 400 proceeds to block 414, where a focused memory test (e.g., the IBIT 205) is performed using the location information from the operational built-in test. If the focused memory test confirms the error, as determined at decision block 416, the method proceeds to block 420, where the processing system 100 is taken offline. In some cases, another processing system (e.g., the processing system 110) is then initialized at block 422. If, however, the focused memory test does not confirm the error, as determined at decision block 416, the method 400 proceeds to block 418, where the processing system 100 is reinitialized, and normal operation can resume at block 408.

Additional processes also may be included, and it should be understood that the process depicted in FIG. 4 represents an illustration, and that other processes may be added or existing processes may be removed, modified, or rearranged without departing from the scope of the present disclosure.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method for testing a memory associated with a processing system of an aircraft, the method comprising:
   performing, during operation of the processing system, an operational built-in test on the memory;
   responsive to detecting an error in the memory during the operational built-in test, performing a focused memory test at a location in the memory of the error; and
   responsive the error being confirmed by the focused memory test, causing the processing system to be taken offline.

2. The method of claim 1, further comprising:
   responsive the error not being confirmed by the focused memory test, reinitializing the processing system.

3. The method of claim 1, further comprising:
   prior to initiating operation of the processing system, performing a power-on built-in test on the memory.

4. The method of claim 3, further comprising:
   responsive to detecting an initialization error during the power-on built-in test, causing the processing system to be taken offline.

5. The method of claim 1, further comprising:
   responsive the error being confirmed by the focused memory test, initiating a backup processing system.

6. The method of claim 1, wherein the processing system is a fly-by-wire flight control computer.

7. The method of claim 1, wherein the focused memory test is performed immediately after detecting the error in the memory during the operational built-in test, and wherein the focused memory test is performed based at least in part on data stored at the location in the memory of the error indicated by the operational built-in test.

8. The method of claim 7, further comprising saving the data stored at the location and the location as saved data and a saved location.

9. The method of claim 8, further comprising using the saved data and the saved location to perform a subsequent power-on built-in test.

10. A flight control computer comprising:
    a memory comprising computer readable instructions; and
    a processing device for executing the computer readable instructions, the computer readable instructions controlling the processing device to perform operations to:
       perform, during operation of the flight control computer, an operational built-in test on the memory;
       responsive to detecting an error in the memory during the operational built-in test, perform a focused memory test at a location in the memory of the error; and
       responsive the error being confirmed by the focused memory test, cause the flight control computer to be taken offline.

11. The flight control computer of claim 10, the computer readable instructions controlling the processing device to perform further operations to, responsive the error not being confirmed by the focused memory test, reinitialize the flight control computer.

12. The flight control computer of claim 10, the computer readable instructions controlling the processing device to perform further operations to, prior to initiating operation of the flight control computer, perform a power-on built-in test on the memory.

13. The flight control computer of claim 12, the computer readable instructions controlling the processing device to perform further operations to, responsive to detecting an initialization error during the power-on built-in test, cause the flight control computer to be taken offline.

14. The flight control computer of claim 10, the computer readable instructions controlling the processing device to perform further operations to, responsive the error being confirmed by the focused memory test, initiate a backup flight control computer.

15. The flight control computer of claim 10, wherein the flight control computer is a fly-by-wire flight control computer.

16. The flight control computer of claim 10, wherein the focused memory test is performed immediately after detecting the error in the memory during the operational built-in test, and wherein the focused memory test is performed based at least in part on data stored at the location in the memory of the error.

17. The flight control computer of claim 16, the computer readable instructions controlling the processing device to perform further operations to save the data stored at the location and the location as saved data and a saved location.

18. The flight control computer of claim 17, the computer readable instructions controlling the processing device to perform further operations to use the saved data and the saved location to perform a subsequent power-on built-in test.

19. A flight control computer comprising:
   a memory; and
   a built-in test logic to:
      perform, during operation of the flight control computer, an operational built-in test on the memory;
      responsive to detecting an error in the memory during the operational built-in test, perform a focused memory test at a location in the memory of the error; and
      responsive the error being confirmed by the focused memory test, cause the flight control computer to be taken offline.

20. The flight control computer of claim 19, the built-in test logic further to:
   responsive the error not being confirmed by the focused memory test, reinitialize the flight control computer;
   prior to initiating operation of the flight control computer, perform a power-on built-in test on the memory to confirm an error detection circuitry of the memory;
   responsive to detecting an initialization error during the power-on built-in test, cause the flight control computer to be taken offline; and
   responsive the error being confirmed by the focused memory test, initiate a backup flight control computer,
   wherein the focused memory test is performed immediately after detecting the error in the memory during the operational built-in test.

* * * * *